(12) United States Patent
Lee et al.

(10) Patent No.: US 8,114,748 B2
(45) Date of Patent: Feb. 14, 2012

(54) SHALLOW EXTENSION REGIONS HAVING ABRUPT EXTENSION JUNCTIONS

(75) Inventors: Kam-Leung Lee, Putnam Valley, NY (US); Paul A. Ronsheim, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 12/491,819

(22) Filed: Jun. 25, 2009

(65) Prior Publication Data

US 2010/0327375 A1    Dec. 30, 2010

(51) Int. Cl.
*H01L 21/336* (2006.01)

(52) U.S. Cl. ............... 438/301; 438/528; 257/E21.437

(58) Field of Classification Search .............. 438/301, 438/528; 257/408
See application file for complete search history.

(56) References Cited

U.S. PATENT DOCUMENTS

| | | | |
|---|---|---|---|
| 6,249,029 B1 | 6/2001 | Bryant et al. | |
| 6,410,430 B1* | 6/2002 | Lee et al. | 438/664 |
| 6,911,376 B2 | 6/2005 | Yoo | |
| 2003/0134514 A1* | 7/2003 | Jang et al. | 438/694 |
| 2004/0115889 A1 | 6/2004 | Jain et al. | |
| 2005/0112830 A1* | 5/2005 | Jain et al. | 438/301 |
| 2007/0059904 A1 | 3/2007 | Izumome | |
| 2008/0050881 A1 | 2/2008 | Chen et al. | |

OTHER PUBLICATIONS

Doping Engineering for Device Fabrication, Materials Research Society Symposium, San Francisco, Apr. 18-19, 2006, pp. 131-136.

* cited by examiner

*Primary Examiner* — Phat Cao
*Assistant Examiner* — Nga Doan
(74) *Attorney, Agent, or Firm* — Scully, Scott, Murphy & Presser, P.C.; Louis J. Percello, Esq.

(57) ABSTRACT

A method of forming a semiconductor device is provided that includes forming a gate structure atop a substrate and implanting dopants into the substrate to a depth of 10 nm or less from an upper surface of the substrate. In a following step, an anneal is performed with a peak temperature ranging from 1200° C. to 1400° C., and a hold time period ranging from 1 millisecond to 5 milliseconds.

16 Claims, 6 Drawing Sheets

SHALLOW EXTENSION REGIONS HAVING ABRUPT EXTENSION JUNCTIONS

FIELD OF THE INVENTION

In one embodiment, the present invention relates to a method of fabricating an abrupt shallow junction in a CMOS device.

BACKGROUND OF THE INVENTION

Smaller CMOS devices typically equate to faster switching times which, in turn, lead to faster and better performing end user systems. The process of miniaturizing CMOS devices involves scaling down various horizontal and vertical dimensions in the CMOS device. In particular, the thickness of the ion implanted source/drain junction of a p-type or n-type transistor is scaled down with a corresponding scaled increase in substrate channel doping. In this manner, a constant electric field is maintained in the transistor channel which typically results in higher speed performance for scaled down CMOS transistors. The formation of source/drain extension junctions in CMOS devices is typically carried out in the prior art by ion implantation in appropriately masked source/drain regions of a Si substrate with boron (p-type) or arsenic and phosphorus (n-type) dopants. Although ion implantation is used in creating the source/drain regions, ion implantation causes crystal damage to the Si substrate as well as the formation of excess Si interstitials. During subsequent thermal annealing, the presence of excess Si interstitial greatly enhances dopant diffusion (10 to 1000 times). This greatly enhanced diffusion of dopants due to the presence of excess Si interstitials around the dopant atoms is commonly referred to in the prior art as transient enhanced diffusion (TED).

SUMMARY OF THE INVENTION

In one embodiment, the present invention provides a method of forming a semiconducting device having activated extension regions that are shallow, i.e., having a depth of 30 nm or less, and abrupt. Broadly, the method includes a forming a gate structure atop a substrate; implanting dopants into the substrate to a depth of 10 nm or less from an upper surface of the substrate; and performing an anneal to a peak temperature ranging from 1200° C. to 1400° C. for a hold time period ranging from 1 millisecond to 5 milliseconds, wherein following the anneal the dopants provide an abrupt junction having a depth of less than 30 nm from an upper surface of the substrate.

In another embodiment, the method of forming a semiconducting device includes forming a gate structure atop a substrate; implanting dopants into the substrate to a depth of 10 nm or less from an upper surface of the substrate; and performing an anneal to a peak temperature ranging from 1200° C. to 1400° C. for a hold time period ranging from 1 millisecond to 5 milliseconds, the hold time at peak temperature representing an anneal pulse, wherein the anneal pulse is repeated to diffuse the dopants in increments of 10 Å or less.

In another aspect, a semiconductor device is provided, in which the semiconductor device includes extension regions that are shallow, i.e., having a depth of 30 nm or less, and abrupt. Broadly, the semiconductor device includes a gate structure present overlying a device channel region of a substrate; and extension regions composed of p-type or n-type dopants present in the substrate abutting the device channel region in a portion of the substrate, the extension regions have a depth of less than 30 nm as measured from an upper surface of the substrate and having a junction to the channel having an abruptness equal to 60 Å/decade or less as measured from an overlying sidewall of the gate structure in a lateral direction towards the channel

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
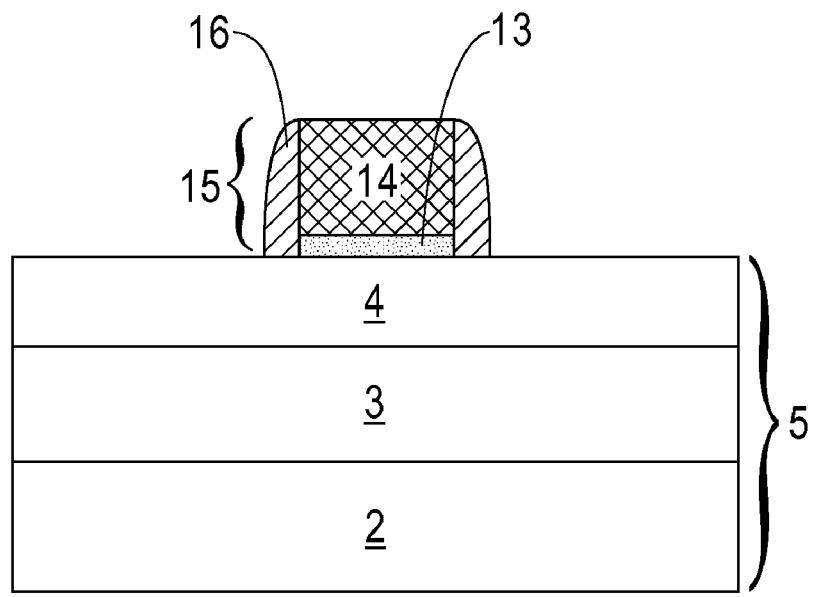
FIG. 1 is a side cross-sectional view depicting an initial structure including a gate structure atop a substrate, as used in accordance with one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present invention, in one embodiment, provides a method of forming a semiconducting device having activated dopant regions that are shallow, i.e., having a depth of 30 nm or less, and abrupt. When describing the inventive methods and structures, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor.

As used herein, "dopant regions" refer to portions of an intrinsic semiconductor material in which the electrical conductivity of the material is dependent upon n-type or p-type dopants.

As used herein, the term "conductivity type" means a dopant that when introduced to an intrinsic semiconductor produces a majority of electron carriers, i.e., n-type, or a majority of hole carriers, i.e., p-type.

As used herein, a "p-type" refers to the addition of trivalent impurities to an intrinsic semiconductor that creates deficiencies of valence electrons, such as the addition of boron, aluminum, or gallium to a type IV semiconductor, such as Si.

As used herein, an "n-type" refers to the addition of pentavalent impurities to an intrinsic semiconductor that contribute free elections, such the addition of antimony, arsenic, or phosphorous to a type IV semiconductor, such as Si.

A "gate structure" means a structure used to control output current (i.e., flow of carriers in the channel) of a semiconducting device, such as a field effect transistor (FET), and includes at least one gate conductor and at least one gate dielectric.

The "channel region" is the portion of the substrate underlying the gate structure and between the dopant regions.

As used herein, the term "abrupt junction" means an interface between dopant regions, such as a source region and a channel region or a drain region and a channel region, where the doping is substantially constant concentration on both sides of the interface and changes at the interface from a first type conductivity to a second type conductivity. The abruptness at the junction has a value of 60 Å/decade or less, which means that for each dimension on the order of 60 Å or less, a change in dopant concentration, is realized by a factor of 10. In one example where the abruptness is equal to 50 Å/decade, over a dimension of 100 Å as measured from the interface of the implant dopant region in the channel direction, the dopant concentration changes by a factor of 100.

For the purposes of this disclosure the term "concentration enhanced diffusion" is diffusion to an equilibrium state by normal diffusion mechanisms independent of defect assisted diffusion.

"Defect assisted diffusion" also referred "transient diffusion" is when dopants are diffused through the substrate via impurity and defect sites.

"Room temperature" is 15° C. to 30° C.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures, Reference is first made to FIGS. 1-3 that illustrate the basic processing steps that may be employed in forming a semiconductor device having activated dopant regions that are shallow, i.e., having a depth of 30 nm or less, and abrupt, which are hereafter referred to as abrupt junctions 25. In one embodiment, the method includes providing a substrate 5, forming a gate structure 15 and offset spacer 16 atop the substrate 5, and implanting dopants 10 into the substrate 5 to a depth D1 of 10 nm or less from an upper surface of the substrate 5. Thereafter, an anneal is performed to a peak temperature ranging from 1200° C. to 1400° C. for a hold time period ranging from 1 ms to 5 ms, wherein following the anneal the dopants 10 provide an abrupt junction 25 having a depth D2 of less than 30 nm from an upper surface of the substrate 5.

Referring to FIG. 1, the substrate 5 may include, but is not limited to: Si-containing materials, GaAs, InAs and other like semiconductors. Si-containing materials as used to provide the substrate 5 include, but are not limited to: Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment in which the substrate 5 is a silicon-on-insulator (SOI) or SiGe-on-insulator (SGOI) substrate, the thickness of the Si-containing layer 4 atop the buried insulating layer 3 can have a thickness on the order of 10 nm or greater. The buried insulating layer 3 may be composed of an oxide, such as silicon oxide, and may have a thickness ranging from 10 nm to 100 nm. The thickness of the Si-containing layer 4 that is underlying the buried insulating layer 3 may range from 10 nm to 500 nm. The SOI or SGOI substrate may be fabricated using a thermal bonding process, or in another embodiment may be fabricated by an ion implantation process.

Still referring to FIG. 1, the gate structure 15 may be formed atop the substrate 5 utilizing deposition, lithography and etching processes. More specifically, in one embodiment, a gate structure 15 is provided atop the substrate 5 by depositing a gate dielectric layer 13 followed by a gate conductor layer 14 to provide a gate stack. In a following process step, the gate stack is patterned using photolithography and etching to produce the gate structure 15. For example, following the deposition of the gate dielectric layer 13 and gate conductor layer 14, an etch mask is formed atop the gate conductor layer 14 protecting the portion of the layered stack that provides the gate stack, wherein the portions exposed by the etch mask are removed by an anisotropic etch process, such as a reactive ion etch. Reactive ion etch is a form of plasma etching, in which the surface to be etched is placed on the RF powered electrode and takes on a potential that accelerates an etching species, which is extracted from a plasma, towards the surface to be etched, wherein a chemical etching reaction takes place in the direction normal to the surface being etched. In one embodiment, the etch mask may be provided by a patterned photoresist layer.

The gate dielectric layer 13 of the gate structure 15 may be composed of an oxide material. Suitable examples of oxides that can be employed as the gate dielectric layer 13 include, but are not limited to: $SiO_2$, $Al_2O_3$, $ZrO_2$, $HfO_2$, $Ta_2O_3$, $TiO_2$, perovskite-type oxides and combinations and multi-layers thereof. The gate dielectric layer 13 may also be composed of a nitride, oxynitride, or a combination thereof including said oxide or the gate dielectric may be composed of multiple layers of the aforementioned materials. The gate conductor layer 14 of the gate stack may be composed of a silicon containing material, which may be polysilicon. In another embodiment, the gate conductor layer 14 is composed of single crystal Si, SiGe, SiGeC or combinations thereof. In another embodiment, the gate conductor 14 may be a metal and/or silicide. In other embodiment, the gate conductor layer 14 is comprised of multilayered combinations of said conductive materials. It is noted that a single gate structure is being depicted for simplicity only, as the present invention is equally applicable to a single gate structure or multiple gate structures. Further, when incorporating multiple gate structures, the devices may be processed to be of the same or different conductivities.

In one embodiment, an offset spacer 16 may be formed abutting the gate structure 15. The offset spacer 16 may comprise a dielectric such as a nitride, oxide, oxynitride, or a combination thereof In one embodiment, in which the offset spacer 16 is composed of an oxide, such as silicon oxide, the offset spacer 16 may be formed by thermal oxidation. In another embodiment, in which the offset spacer 16 is composed of a nitride, such as silicon nitride, the offset spacer 16 may be formed using deposition and etch processes. Typically, the offset spacers 16 have a width ranging from 3 nm to 15 nm, and in some examples ranging from 6 nm to 12 nm.

Figure 2:
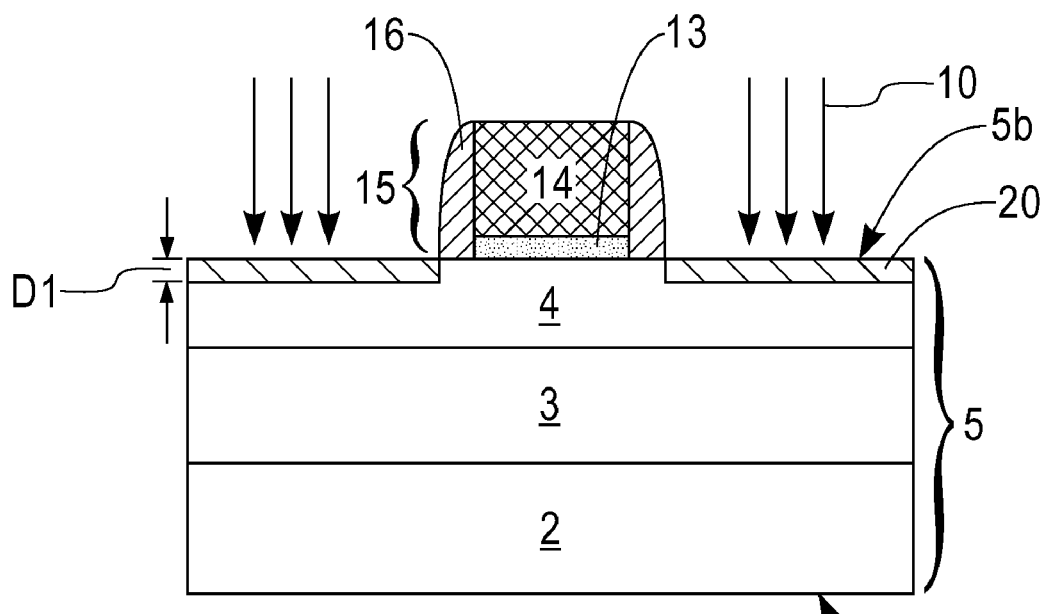
FIG. 2 is a side cross-sectional view depicting one embodiment of implanting dopants into the substrate to provide extension source and drain regions, in accordance with the present invention.

FIG. 2 depicts implanting dopants 10 into the substrate 5, in accordance with one embodiment of the present invention. This implant step may provide the extension region portions of the source regions and drain regions of the device. A doped region 20 may be formed in the substrate 5 by implanting a first conductivity type dopant, i.e., n-type dopant, or second conductivity type dopant, i.e., p-type dopant, into the substrate 5. Illustrative examples of n-type dopants that can be employed in the present invention include, but are not limited to As or P. Illustrative examples of p-type dopants include, but are not limited to B or In. In one embodiment, the source of the dopant ion is usually in the form of a molecular complex ion derived from $BF_2$, $B_{10}H_{14}$ or $As_2$ gas sources.

The dopant ion implantation step 10 may be conducted using an ion implantation apparatus that operates at energies of from 0.3 KV to 50 KV. In another embodiment, the dopant ion implantation step 10 is carried out at an energy ranging from 0.5 KV to 20 KV. In an even further embodiment, the dopant ion implantation step 10 is carried out at an energy ranging from 0.2 KV to 5.0 KV.

The dosage of dopant ions implanted in this step of the present invention may be in the range of from $1 \times 10^{14}/cm^2$ to $1 \times 10^{16}/cm^2$. In another embodiment, the dosage of the dopant ions implanted in this step of the present invention ranges from $3 \times 10^{14}/cm^2$ to $5 \times 10^{15}/cm^2$. In another embodiment, the dosage of the dopant ions implanted in this step of the present invention ranges from $1 \times 10^{15}/cm^2$ to $3 \times 10^{15}/cm^2$.

Using the above-defined parameters, the dopant ion is implanted to a depth D1 of 15 nm or less, as measured from the upper surface of the substrate 5. In another embodiment, the dopant ion is implanted to a depth D1 of 10 nm or less. In an even further embodiment, the dopant ion is implanted to a depth D1 ranging from 2 nm to 5 nm.

Figure 3:
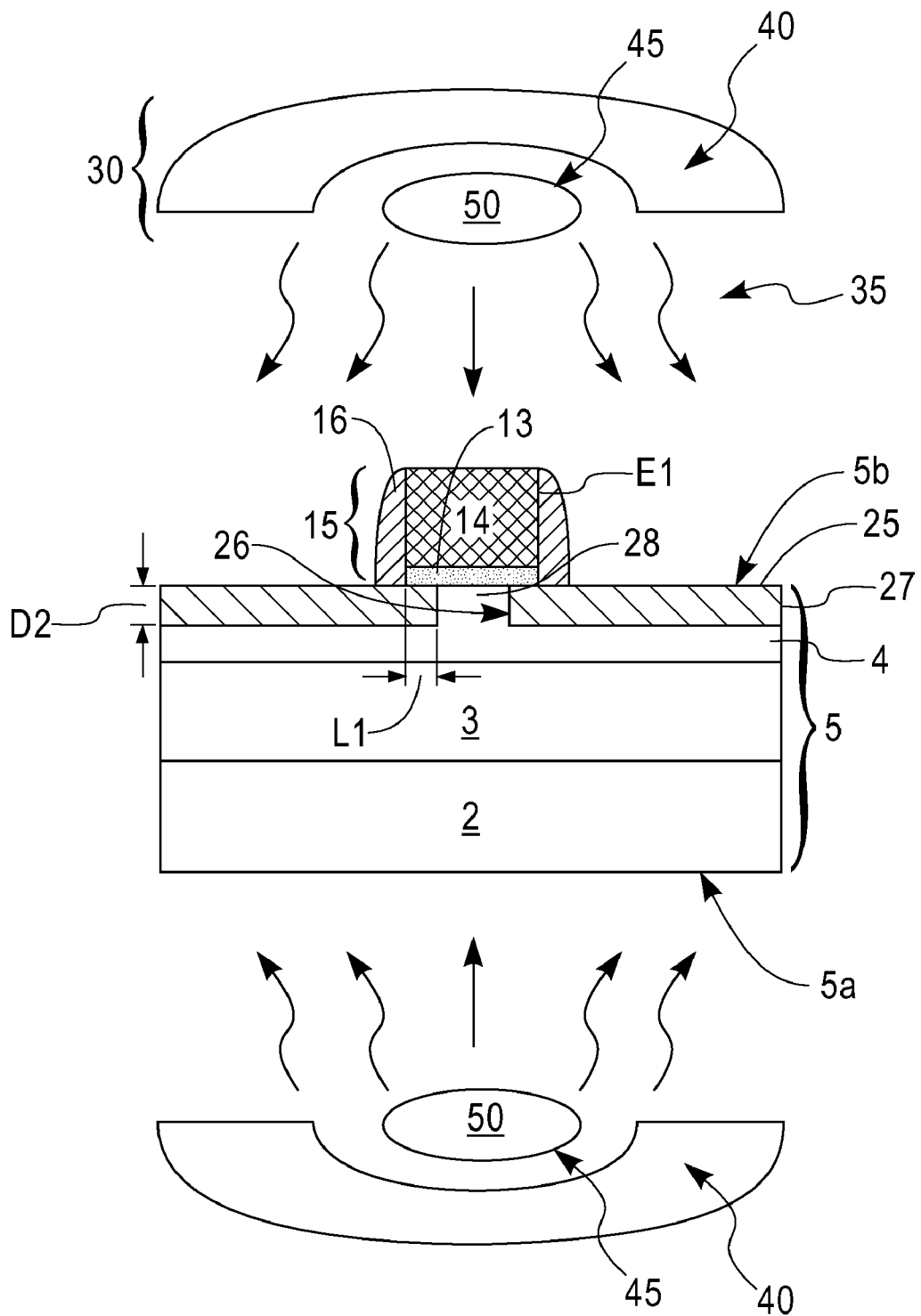
FIG. 3 is a side cross-sectional view depicting one embodiment of performing an anneal, wherein following the annealing the dopants provide an abrupt junction having a depth of less than 30 nm from an upper surface of the substrate, in accordance with the present invention.

Next, as shown in FIG. 3, the structure of FIG. 2 is subjected to a heating step, hereafter referred to as an annealing step. The annealing step may include an activation and diffusion anneal to a peak temperature ranging from 1200° C. to 1400° C. for a hold time period ranging from 1 ms to 5 ms, wherein following the annealing the dopants provide an abrupt junction 25 having a depth D2 of less than 30 nm from an upper surface of the substrate.

The annealing may provide an abrupt junction 25 having a depth D2 of less than 30 nm or less from the upper surface of the substrate 5. In another embodiment, the depth D2 of the abrupt junction 25 may range from 15 nm to 30 nm. In a further embodiment, the depth D2 of the abrupt junction 25 may range from 10 nm to 20 nm. In one embodiment, the abrupt junction 25 extends to underlie the gate structure 15 by a dimension L1 ranging from 2 nm to 10 nm, as measured from the intersection of the upper surface of the substrate and a sidewall E1 of the gate structure 15. In another embodiment, the abrupt junction 25 extends to underlie the gate structure 15 by a dimension L1 ranging from 1 nm to 5 nm, wherein in one example the abrupt junction 25 extends to underlie the gate structure 15 by a dimension L1 ranging from 3 nm to 5 nm.

The abrupt junction 25 includes an interface 26 between the doped region 27 and the channel region 28. In one embodiment, the doped region 27 may be composed of a first conductivity type dopant and the channel region 28 may be composed of a second conductivity type dopant. In one example, the interface 26 is the transition from a majority of first conductivity type dopants to a majority of a non-first conductivity type dopant, such as second conductivity type dopants.

The dopant concentration that is present in the doped region 27 may range from $1 \times 10^{20}/cm^3$ to $1 \times 10^{22}/cm^3$. The dopant concentration is the average concentration for the entire volume of the doped region 27 that provides the abrupt junction 25. In one embodiment, and when arsenic is the dopant of dopant region 27 of the abrupt junction, the dopant concentration may range from $1 \times 10^{20}/cm^3$ to $1 \times 10^{22}/cm^3$. In another embodiment, and when boron is the dopant of the dopant region 27 of the abrupt junction 25, the dopant concentration may range from $1 \times 10^{20}/cm^3$ to $1 \times 10^{22}/cm^3$.

In one embodiment, the channel region 28 is composed of a second conductivity that is an opposite conductivity than the doped region 27 of the abrupt junction 25. In one embodiment, the dopant concentration of the channel region 28 ranges from $1 \times 10^{18}/cm^3$ to $1 \times 10^{19}/cm^3$. In another embodiment, the dopant concentration of the second conductivity type dopant that is present in the channel region 28 ranges from $1 \times 10^{17}/cm^3$ to $1 \times 10^{20}/cm^3$.

The abruptness of the interface 26 between the doped region 27 of the abrupt junction 25 and the device channel region 28 is typically less than 50 Å/decade, as measured from the portion of the abrupt junction 25 that is underlying the edge E1 of the gate structure 15 in a direction towards the midpoint of the channel as measured from the source region to the drain region of the device. In one embodiment, the abruptness of the interface 26 is equal to 30 Å/decade or less for abrupt junctions 25 composed of n-type dopants. In one embodiment, the abruptness of the interface 26 is equal to 55 Å/decade or for abrupt junctions composed of p-type dopants. In an even further embodiment, the abruptness of the interface 26 between the doped region 27 and the channel region 28 of the abrupt junction 25 is equal to 20 Å/decade. In one embodiment in which the abrupt junction 25 is composed of an n-type dopant, the abrupt junction 25 has a sheet resistance of less than 500 ω/m². In one embodiment, in which the abrupt junction 25 is composed of p-type dopant, the abrupt junction 25 has a sheet resistance of less than 600 ω/m².

In one embodiment, the annealing step includes flash annealing to provide a temperature spike that ranges from 1200° C. to 1400° C., wherein the temperature spike is held with flash annealing for a hold time period ranging from 1 millisecond to 5 milliseconds. In another embodiment, the peak temperature ranges from 1200° C. to 1350° C. and the hold time period ranges from 1.0 millisecond to 2.5 milliseconds. It is noted that although the following disclosure is specific to flash annealing that the present invention may also be practiced using other anneal processes, such as laser anneal and microwave anneal, so long as the anneal apparatus can provide peak temperatures ranging from 1200° C. to 1400° C., in combination with hold times ranging from 1 millisecond to 5 milliseconds.

Referring to FIGS. 2, 3, 4A and 4B, the annealing may include a ramp up step from a temperature ranging from 20° C. to 900° C., which may be may be provided by a flash anneal to the back of the wafer, i.e., the lower or bottom surface 5a of the substrate 5. In one embodiment, following the ramp up a temperature range of 400° C. to 900° C., a second flash anneal to the front of the wafer, i.e., the upper or top surface 5b of the substrate 5, increases the temperature of the dopant regions 20 to peak temperature. The annealing may include a ramp up step from room temperature, e.g., approximately 20° C., to an intermediate temperature in the range of 400° C. to 900° C. to the peak temperature in 1 millisecond or less. In one embodiment, intermediate temperature ranges from 500° C. to 900° C.

It is noted that the lower or bottom surface 5a of the substrate 5 may be referred to as a first surface, and the upper or top surface 5b of the substrate 5 may be referred to as a second surface, wherein the first surface of the substrate 5 is opposite or opposing the second surface of the substrate 5.

Following ramp up to approximately 900° C., the flash anneal then provides a temperature spike to 1200° C. to 1400° C., wherein the temperature spike is held for a hold time period ranging from 1 millisecond to 5 milliseconds. As used herein, the word "flash anneal" means to give off light energy substantially instantaneous or in transient bursts for a duration of time between 1 nanosecond and 10 seconds. Typically, consistent with the present method, peak temperatures less than 1200° C. may not sufficiently reduce the impurity/implant defect concentration within the substrate to eliminate defect-assisted diffusion. Further, peak temperatures greater than 1400° C. may reduce the crystalline nature of the substrate, e.g., Si-containing substrate. Additionally, in some embodiments, increasing the peak temperature hold time to greater than 5 milliseconds may increase diffusion, and hence increase junction depth.

FIG. 3 depicts a simplified illustration of one embodiment of a flash anneal assembly 30, in accordance with the present invention. Flash anneal assembly 30 is used to provide a heat treatment to the substrate 5, more specifically the Si-containing layer 4 including the dopant regions. In this embodiment, flash anneal assembly 30 is positioned proximate to substrate 5, such that radiation energy 35 emitted from flash anneal assembly 30 can impinge on the Si-containing layer 4. As described in detail below, radiation energy 35 heats the dopant regions 20 to a temperature required for activation and diffusion of dopant in the abrupt junction 25.

In practice, during flash anneal the substrate 5 may be positioned in a process chamber, which includes flash anneal assembly 30. The flash anneal assembly 30 may include a reflector 40 and a radiation energy source 45. In one embodiment, the radiation energy source 45 can be a high-intensity lamp of the type conventionally used in lamp heating operations. For example, the radiation energy source 45 may be a filament-less lamp, such as a Xe arc lamp (hereinafter "lamp 50"). Lamp 50 can be any suitably shaped lamp, for example, a cylindrical tube shaped lamp. While FIG. 3 is a simplified illustration of an embodiment, in which a single lamp is shown disposed proximate to reflector 40, it should be understood that any number of lamps 50 can be to achieve the desired heating levels required of the present invention. In one embodiment, the lamp 50 can be surrounded by a flow tube. The flow tube can contain a cooling fluid, for example, deionized water, which may be used to keep the lamp from overheating during operation.

The reflector 40 may include an inner surface that can be highly reflective of certain wavelengths and absorptive or non-reflective of others. In one embodiment, inner surface can be coated with a material, which has a reflecting/absorbing characteristic. To facilitate the concentration of energy at the dopant regions 20, the reflector 40 may be formed into any suitable geometric shape. For example, reflector 40 may be flat, spherical, elliptical or parabolic. The light energy from lamp 50 can be focused at the center or focal point of reflector 40 to be directed toward surface of substrate 5. The radiation emitted from lamp 50 and reflected from inner surface of reflector 40 impinges on surface of the substrate 5, as simply and representatively illustrated by rays 35, to provide a uniform temperature distribution across the surface of substrate 5 of support substrate 5, which heats the dopant region 20.

The temperature to which dopant region 20 is heated is a function of the relationship between the power supplied to lamp 50 and the length of time, which the radiation energy is allowed to impinge on surface of the substrate 5. As shown in FIG. 4B, in one embodiment, the temperature of dopant region may be raised to a peak temperature in the range from between 1100° C. (low) to 1300° C. (high) for a time period ranging from 2 milliseconds to 2.5 milliseconds. The time period that the temperature is sustained at the peak temperature is referred to as the peak temperature dwell time. To achieve these temperatures, the wafer is exposed to a flash anneal, which provides light energy suddenly or substantially instantaneously, for example, for a duration of time between 1 nanosecond and 10 milliseconds, more typically being less 5 milliseconds. The power level can range from between 80 J/cm² and 200 J/cm².

Figure 4A:
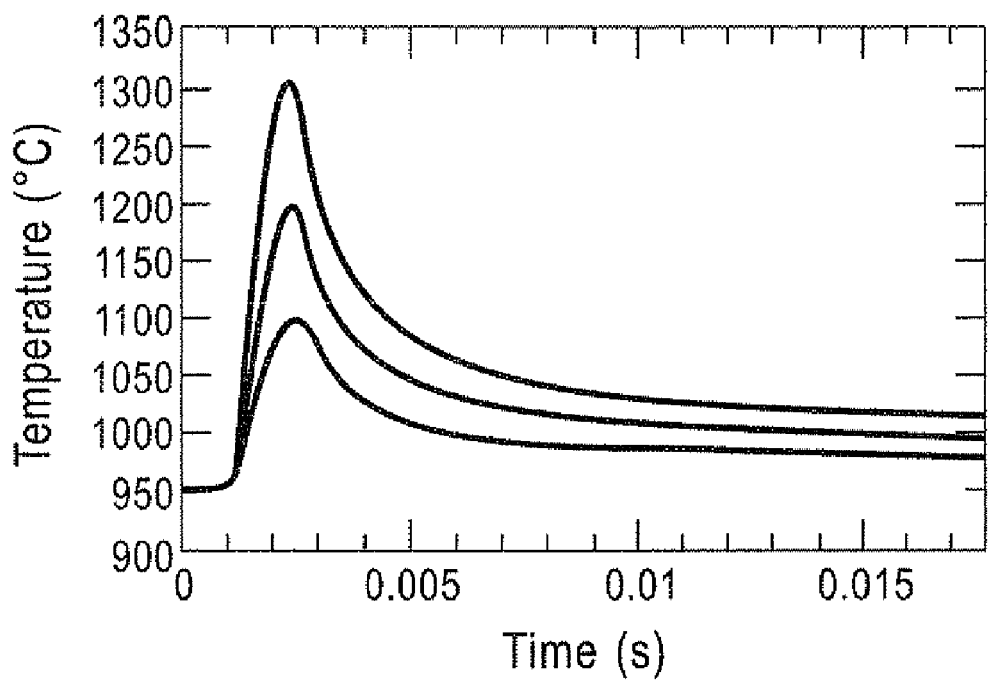
FIG. 4A is a plot that provides a comparative example, wherein the plot depicted in FIG. 4A is an anneal spike having a peak temperature hold time period of less than 1 millisecond.
Figure 4B:
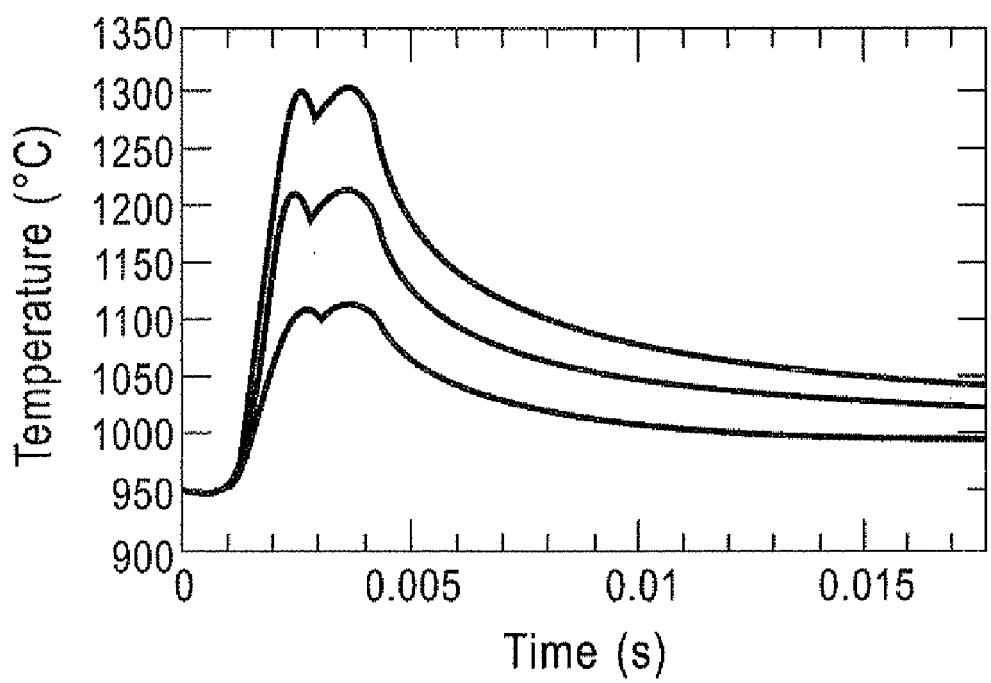
FIG. 4B is a plot depicting one embodiment of the inventive anneal including a hold time period ranging from 1 millisecond to 5 milliseconds at the peak anneal temperature, as used in accordance with the present invention.

For comparison purposes, FIG. 4A depicts the temperature curves of a temperature spike that does not include a peak temperature dwell time, wherein the time at the peak temperature is less than 1 millisecond.

Figure 5A:
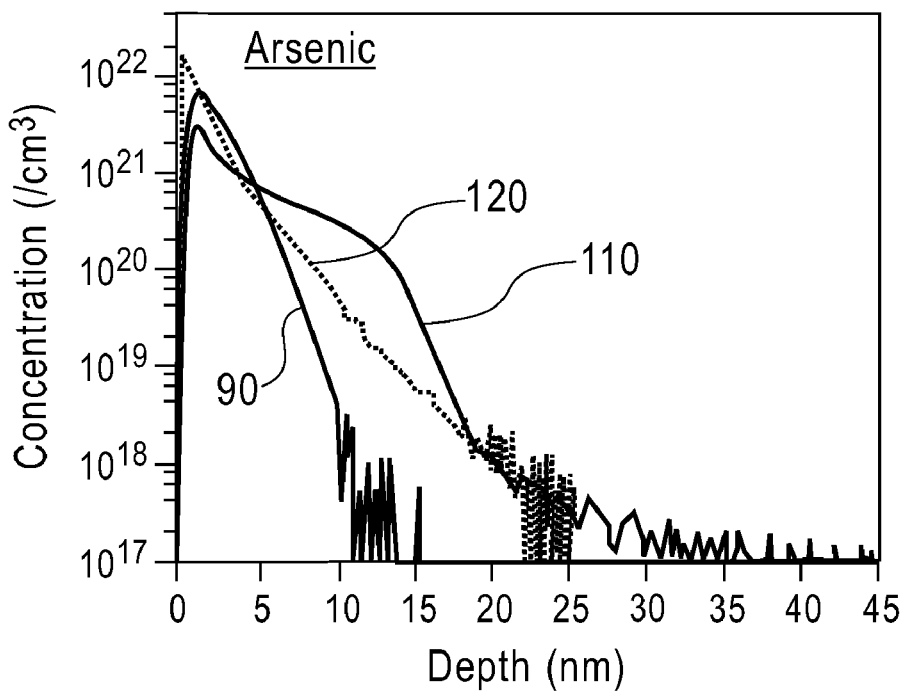
FIG. 5A is a plot depicting the diffusion of arsenic (As) using one embodiment of the inventive anneal having a hold time at peak temperature ranging from 1 millisecond to 5 milliseconds, in comparison to the diffusion of arsenic (As) using an anneal process that has a hold time at peak temperature of less than 1 millisecond.

FIG. 5A is a plot depicting the diffusion of arsenic (As) that has been implanted into the substrate to provide a dopant region that has been activated using flash annealing having a temperature curve similar to that depicted in FIG. 4B, in comparison to a similarly prepared dopant region that has been activated using a temperature curve that does not include the peak temperature dwell time, as depicted in FIG. 4A. The y-axis is the dopant concentration and the x-axis of the plot is the depth (nm) measured from the upper surface 5b of the substrate 5 (as depicted in FIGS. 2 and 3). Referring to FIG. 5A, the slope of this line represents abruptness. Reference number 90 is a control in which an anneal has not been performed on the dopant region.

Reference line 120 depicts the dopant concentration in the substrate as measured from the upper surface of the substrate, wherein the arsenic (As) has been implanted with an energy on the order of 1.5 kEV at a dose of 2×10¹⁵ atoms/cm², and has been activated using an anneal process including a rapid thermal anneal to provide a temperature curve similar to that depicted in FIG. 4B. The sample depicted by reference line 120 had a sheet resistance of approximately 750 ohm/sq and an abruptness on the order of 3.2 nm/decade. The abruptness of the sample depicted by reference line 120 was measured at a dopant concentration on the order of $1 \times 10^{19}/cm^3$, which corresponded to a depth being less than 30 nm. More specifically, in this example, the depth was approximately 17 nm.

Referring to FIG. 5A, reference line 110 depicts the dopant concentration in the substrate as measured from the upper surface 5b of the substrate 5 (as depicted in FIGS. 2 and 3), wherein the arsenic (As) has been implanted with an energy on the order of 1.5 kEV at a dose of approximately $2 \times 10^{15}$ atoms/cm$^2$, wherein the dopant region has been activated using a temperature spike having the temperature curve depicted in FIG. 4B. The sample depicted by reference line 110 had a sheet resistance of approximately 480 ohm/sq and an abruptness on the order of 2.6 nm/decade. The abruptness of the sample depicted by reference line 110 was measured at a dopant concentration on the order of $1 \times 100^{19}/cm^3$, which corresponded to a depth being less than 30 nm. More specifically, in this example, the depth was approximately 20 nm.

Comparison of reference line 110 to reference line 120 illustrates a concentration enhancement that is produced by the flash anneal process of the present invention, which can include a peak temperature dwell on the order of 2.0 milliseconds to 2.5 milliseconds at a peak temperature ranging from 1100° C. to 1300° C. More specifically, the flash anneal process, as used in accordance with the present invention, results in a concentration enhanced diffusion with an more abrupt As junction when compared to junction that have been activated using a temperature curve that does not include the peak temperature dwell time, similar to that depicted in FIG. 4A.

Figure 5B:
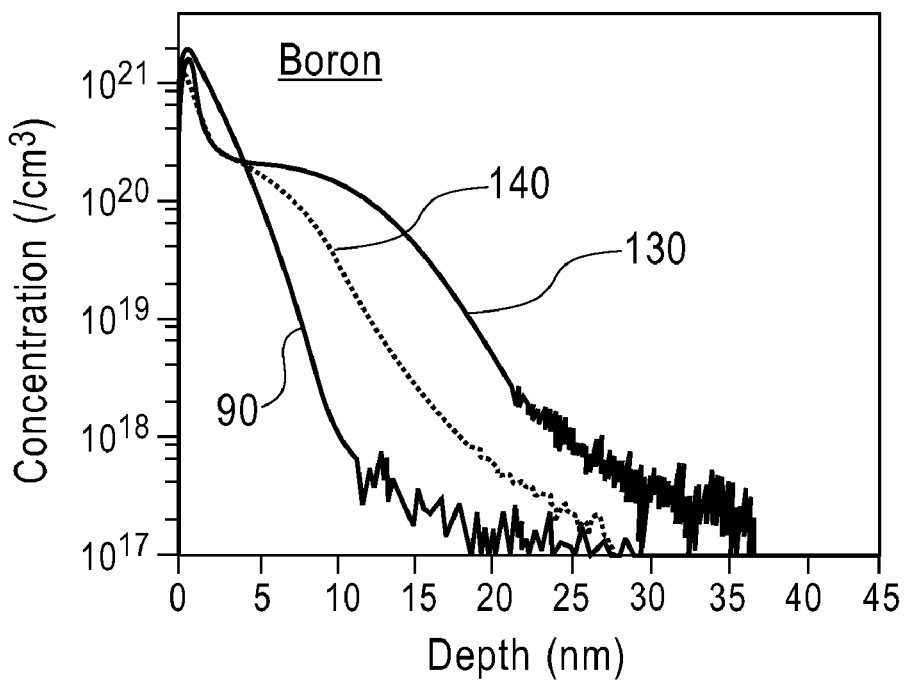
FIG. 5B is a plot depicting the diffusion of boron (B) using one embodiment of the inventive anneal having a hold time at peak temperature ranging from 1 millisecond to 5 milliseconds, in comparison to the diffusion of boron (B) using an anneal process that has a hold time at peak temperature of less than 1 millisecond.

FIG. 5B is a plot depicting the diffusion of boron (B) that has been implanted into the substrate 5 to provide a dopant region that has been activated using flash annealing to provide the temperature curve similar to that depicted in FIG. 4B, in comparison to a similarly prepared dopant region that has been activated using a temperature curve that does not include the peak temperature dwell time, as depicted in FIG. 4A. The y-axis is the dopant concentration and the x-axis of the plot is the depth (nm) measured from the upper surface 5b of the substrate 5 (as depicted in FIGS. 2 and 3). Referring to FIG. 5B, the slope of this line 90, 130, 140 represents abruptness. Reference number 90 is a control in which an anneal has not been performed on the dopant region.

Reference line 140 depicts the dopant concentration in the substrate 5 as measured from the upper surface of the substrate 5, wherein the boron (B) has been implanted with an energy on the order of 1.5 kEV at a dose of approximately $1.5 \times 10^{15}$ atoms/cm$^2$, and has been activated using an anneal process including a rapid thermal anneal to provide a temperature curve similar to that depicted in FIG. 4A. The sample depicted by reference line 140 had a sheet resistance of approximately 1193 ohm/sq and an abruptness on the order of 5.6 nm/decade. The abruptness of the sample depicted by reference line 130 was measured at a dopant concentration on the order of $1 \times 10^{19}/cm^3$, which corresponded to a depth being less than 30 nm. More specifically, in this example, the depth was approximately 20 nm.

Reference line 130 depicts the dopant concentration in the substrate 5 as measured from the upper surface of the substrate 5, wherein the Boron (B) has been implanted with an energy on the order of 1.5 kEV at a dose of approximately $1.5 \times 10^{15}$ atoms/cm$^2$, wherein the dopant region has been activated using a temperature spike having the temperature curve depicted in FIG. 4B. The sample depicted by reference line 130 had a sheet resistance of approximately 600 ohm/sq and an abruptness on the order of 5.2 nm/decade. The abruptness of the sample depicted by reference line 130 was measured at a dopant concentration on the order of $1 \times 10^{19}$, which corresponded to a depth being less than 30 nm. More specifically, in this example, the depth was approximately 20 nm.

Comparison of reference line 130 to reference line 140 illustrates a concentration enhancement that is produced by the flash anneal process of the present invention, which includes a peak temperature dwell on the order of 2.0 milliseconds to 2.5 milliseconds at a peak temperature ranging from 1100° C. to 1300° C. More specifically, the flash anneal process, as used in accordance with the present invention, results in a concentration enhanced diffusion with an more abrupt B junction when compared to junction that have been activated using a temperature curve that does not include the peak temperature dwell time, similar to that depicted in FIG. 4A.

Figure 6A:
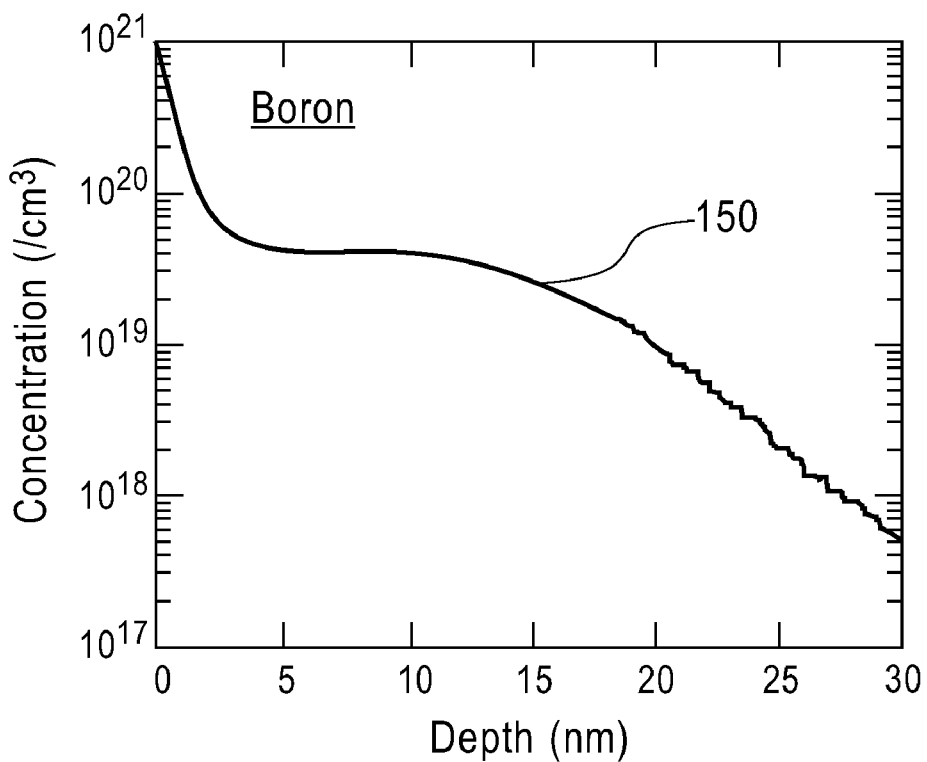
FIGS. 6A and 6B are plots depicting a comparison of boron (B) junctions formed with an anneal process that has a hold time at peak temperature of less than 1 millisecond to boron (B) junctions formed with a hold time at peak temperature ranging from 1 millisecond to 5 milliseconds, as used in accordance with the present invention.
Figure 6B:
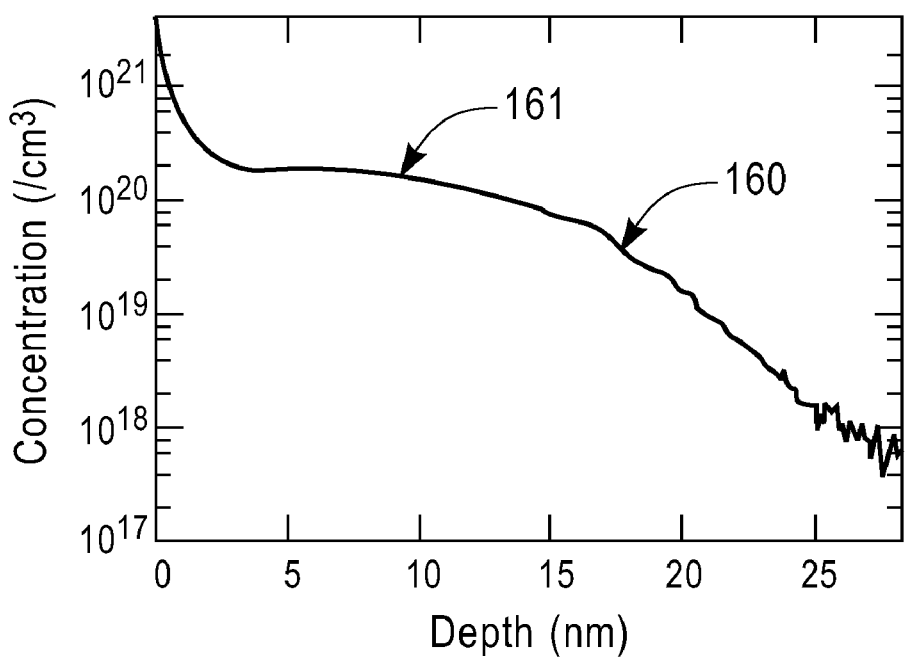

FIGS. 6A and 6B depict a comparison of boron (B) junctions activated with a rapid thermal anneal to approximately 1070° C. with a temperature spike followed by laser annealing to 1250° C. with no peak temperature dwell, as depicted by reference number 150 in FIG. 6A, in comparison to boron (B) junctions that are activated by a thermal process including a flash anneal to a temperature of approximately 1300° C. with a peak temperature dwell time of approximately 2 milliseconds, as depicted by reference number 160 in FIG. 6B.

The plot indicated by reference number 160 in FIG. 6B is a plot of boron concentration vs. depth for dopant regions activated using a flash anneal to a temperature of approximately 1300° C. with a peak temperature dwell time of approximately 2 milliseconds. The dopant regions from which the plots indicated by reference number 160 were produced have a sheet resistance on the order of approximately 530 ohm/sq and an abruptness of approximately 5.2 nm/decade. The abruptness of the sample depicted by reference line 160 was measured at a dopant concentration on the order of $1 \times 10^{19}/cm^3$, which corresponded to a depth being less than 30 nm. More specifically, in this example, the depth was approximately 20 nm.

The plot indicated by reference number 150 in FIG. 6A is a plot of boron concentration vs. depth for dopant regions activated using a rapid thermal anneal to a temperature spike of approximately 1070° C. followed by a laser anneal of 1250° C. spike without any peak temperature dwell time. The dopant regions from which the plots indicated by reference number 150 were produced have a sheet resistance on the order of approximately 1200 ohm/sq and an abruptness of approximately 5 nm/decade. The abruptness of the sample depicted by reference line 150 was measured at a dopant concentration on the order of $1 \times 10^{19}/cm^3$, which corresponded to a depth being less than 30 nm. More specifically, in this example, the depth was approximately 20 nm.

Comparison of the plots depicted in FIGS. 6A and 6B illustrate that comparable junction depth, i.e., less than 30 nm, and abruptness, i.e., approximately 5 nm/decade, are produced in both cases, but the dopant concentration in the boron plateau region 161 is higher for dopant regions activated using a flash anneal to a temperature of approximately 1300° C. with a peak temperature dwell time of approximately 2 milliseconds, as depicted by reference line 160 in FIG. 6B. More specifically, the boron concentration at greater than $1 \times 10^{20}/cm^3$ in the junction created by the flash anneal to a temperature of 1300° C. with a peak temperature dwell time of approximately 2 millisecond, i.e., reference number 160 in FIG. 6B, in comparison to the boron junction created by the rapid thermal anneal in combination with laser annealing without any peak temperature dwell, i.e., reference number 150 in FIG. 6A. Further, the anneal process utilized to provide the plot depicted in FIG. 6B produces a lower sheet resistance, e.g., 600 ohm/sq, than the anneal process that is utilized to provide the plot depicted in FIG. 6A at substantially the same junction depths.

Figure 7:
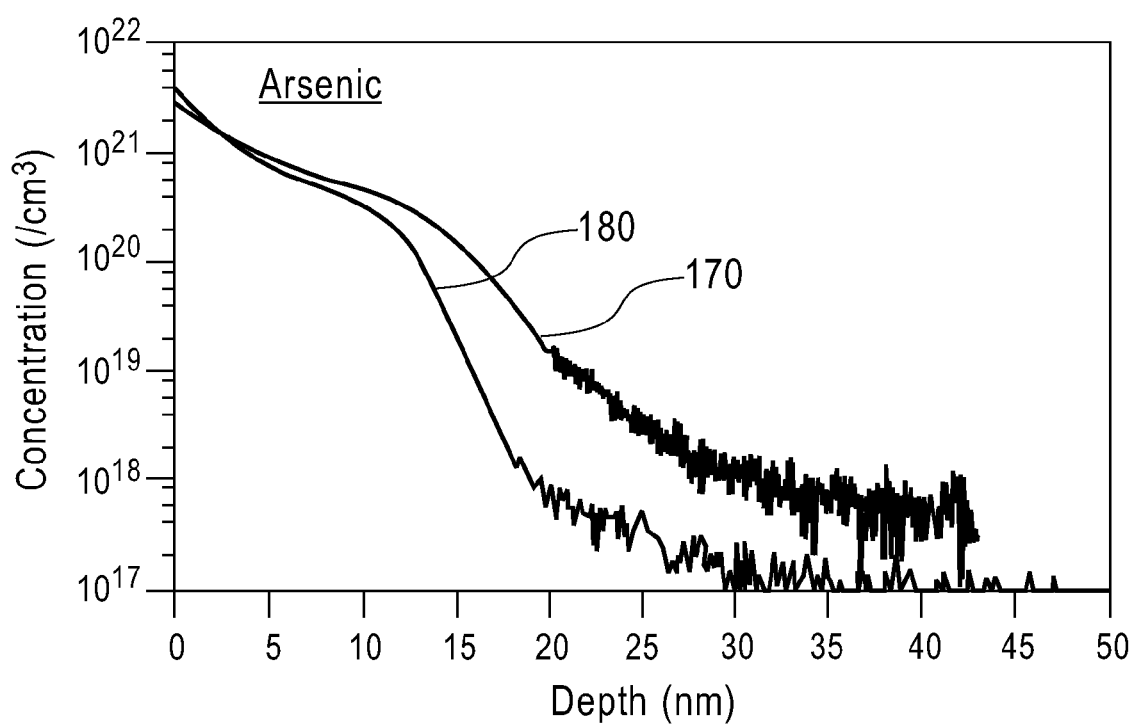
FIG. 7 is a plot depicting a comparison of arsenic (As) junctions formed using an anneal process that has a hold time at peak temperature of less than 1 millisecond to (As) junctions formed using an anneal process with a hold time at peak temperature ranging from 1 millisecond to 5 milliseconds, in accordance with one embodiment of the present invention.

FIG. 7 depicts a comparison of arsenic (As) junctions activated with a rapid thermal anneal to approximately 1070° C. with a temperature spike followed by laser annealing to 1250° C. spike with no peak temperature dwell time, as depicted by the plot indicated by reference number 170, in comparison to arsenic (As) junctions that are activated by a thermal process including a flash anneal to a temperature of approximately 1300° C. with a peak temperature dwell time of approximately 2 milliseconds, as depicted by the plot indicated by reference number 180.

The plot indicated by reference number 180 is a plot of arsenic concentration vs. depth for dopant regions activated using a flash anneal to a temperature of approximately 1300° C. with a peak temperature dwell time of approximately 2 milliseconds. The dopant regions from which the plots indicated by reference number 180 were produced have a sheet resistance on the order of approximately 480 ohm/sq and an abruptness of approximately 2.6 nm/decade. The abruptness of the sample depicted by reference line 180 was measured at a dopant concentration on the order of $1 \times 10^{19}$, which corresponded to a depth being less than 30 nm. More specifically, in this example, the depth was approximately 20 nm.

The plot indicated by reference number 170 is a plot of arsenic concentration vs. depth for dopant regions activated using a rapid thermal anneal to approximately 1070° C. followed by a laser anneal to 1250° C. spike without any peak temperature dwell time. The dopant regions from which the plots indicated by reference number 150 were produced have a sheet resistance on the order of approximately 389 ohm/sq and an abruptness of approximately 8.2 nm/decade. The abruptness of the sample depicted by reference line 170 was measured at a dopant concentration on the order of $1 \times 10^{19}/cm^3$, which corresponded to a depth being less than 30 nm. More specifically, in this example, the depth was approximately 20 nm.

Comparison of the plots 170, 180 depicted in FIG. 7A illustrates that junctions composed of As and created using similar implantation dose of $2 \times 10^{15}/cm^2$ at an implant energy of 2.0 kV, which are activated with a flash anneal having a peak temperature dwell time on the order of approximately 2 milliseconds, are shallower and more abrupt than the As junctions that are activated using a combination of rapid thermal anneal and laser annealing with no peak temperature dwell time. More specifically, As junctions that are activated with a flash anneal having a peak temperature dwell time on the order of approximately 2 milliseconds were measured having a junction depth of approximately 20 nm and having an abruptness on the order of approximately 2.6 nm/decade, whereas As junctions activated by the rapid thermal anneal in combination with laser annealing without any peak temperature dwell time, were measured having a junction depth of approximately 30 nm and having an abruptness on the order of approximately 8.2 nm/decade.

In one embodiment, the above described anneal process may be utilized to control the diffusivity of dopants in providing a junction that underlies the gate structure, More specifically, in one embodiment, the present invention provides a method of forming a semiconductor device that includes forming a gate structure atop a substrate, implanting dopants into the substrate to a depth of 10 nm or less from an upper surface of the substrate, and performing an anneal to a peak temperature ranging from 1200° C. to 1400° C. for a hold time period ranging from 1 millisecond to 5 milliseconds, the hold time at peak temperature representing an anneal pulse, wherein the anneal pulse is repeated to diffuse the dopants in increments of 10 Å or less. In one example, the first anneal pulse (also referred to as initial anneal pulse) eliminates implant damages in the substrate, therefore substantially eliminating defect assisted diffusion of the dopants. By substantially eliminating implant damage it is meant that the implant damage in the substrate is reduced to a concentration of 0.05% or less. Defect assisted diffusion is typically a faster transient mode of diffusion than concentration enhanced diffusion, wherein defect assisted diffusion typically does not allow for the degree of diffusion controllability that is provided by the present invention. Once, the first anneal pulse removed the impurities from the substrate, second anneal pulses diffuse the dopants by concentration enhanced diffusion, wherein each second anneal pulse diffuses the dopants a distance of 10 Å or less. For example, each second anneal pulse may diffuse the dopants a distance of 7 Å or less, or 5 Å or less, depending on the hold time period and the peak temperature.

In one embodiment, in addition to providing the above described abrupt junctions 25, the present invention simplifies processing by only requiring the use of a single apparatus, such as a flash anneal apparatus, for anneal, as opposed to a combination of rapid thermal anneal and laser anneal operations.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed:

1. A method of forming a semiconductor device comprising:
    forming a gate structure atop a substrate;
    implanting dopants into the substrate to a depth of 10 nm or less from an upper surface of the substrate;
    performing a first anneal to remove implant damage and defects in the substrate, wherein the first anneal substantially eliminates defect assisted diffusion of the dopants; and
    performing a second anneal to a peak temperature ranging from 1200° C. to 1400° C. for a hold time period ranging from 0.5 millisecond to 5 milliseconds, wherein during the second anneal the dopants diffuse by concentration enhanced diffusion to form an abrupt junction having a depth of less than 30 nm from an upper surface of the substrate.

2. The method of claim 1, wherein the abruptness of the abrupt dopant region produced by the implanting of the dopants into the substrate, the first anneal, and the second anneal is less than 50 Å/decade.

3. The method of claim 1, wherein the abruptness of the abrupt dopant region produced by the implanting of the dopants into the substrate, the first anneal and the second anneal is less than 10 Å/decade.

4. The method of claim 1, wherein the abrupt junction extends to underlie the gate structure by a dimension ranging from 1 nm to 5 nm, as measured from the intersection of the upper surface of the substrate and a sidewall of the gate structure.

5. The method of claim 1, wherein the implanting of the dopants into the substrate includes p-type dopants or n-type dopants.

6. The method of claim 5, wherein the implanting of the p-type dopants comprises B, Ga, In, or a combination thereof, and the implanting of the n-type dopants comprises As, Sb or P.

7. The method of claim 1, wherein the implanting of the dopants into the substrate includes ion implantation at an energy ranging from 0.3 KV to 50 KV.

8. The method of claim 1, wherein the implanting of the dopants into the substrate comprises a dosage ranging from $1 \times 10^{14}$ atoms/cm$^2$ to $1 \times 10^{16}$ atoms/cm$^2$.

9. The method of claim 1, wherein the annealing to the peak temperature comprises flash annealing, microwave annealing, laser annealing or a combination thereof.

10. The method of claim 1, wherein the first anneal includes a ramp up step from approximately room temperature to an intermediate temperature ranging from 400° C. to 900° C., and the second anneal is to the peak temperature in 1 millisecond or less, wherein the method further includes a ramp down step from the peak temperature to the intermediate temperature ranging from 900° C. to 400° C. to approximately room temperature in 1 millisecond or less.

11. The method of claim 10 wherein the intermediate temperature ranges from 500° C. to 900° C.

12. The method of claim 1, wherein the hold time period at the peak temperature ranges from 0.5 milliseconds to 2.5 milliseconds.

13. The method of claim 1, wherein the peak temperature ranges from 1200° C. to 1350° C.

14. The method of claim 1, wherein the dopants are n-type dopants and the abrupt junctions have an abruptness of 30 Å/decade or less in a direction towards the channel region, or wherein the dopants are p-type dopants and the abrupt junctions have an abruptness of 55 Å/decade or less in a direction towards the channel region.

15. The method of claim 1, wherein the abrupt junction is composed of an n-type dopant, the abrupt junction has a sheet resistance of less than 500 Ω/sq, or wherein the abrupt junction is composed of p-type dopant, the abrupt junction has a sheet resistance of less than 600 Ω/sq.

16. A method of forming a semiconductor device comprising:
    forming a gate structure atop a substrate;
    implanting dopants into the substrate to a depth of 10 nm or less from an upper surface of the substrate;
    performing a first anneal to remove implant damage and defects in the substrate, wherein the first anneal substantially eliminates defect assisted diffusion of the dopants; and
    performing a second anneal to a peak temperature ranging from 1200° C. to 1400° C. for a hold time period ranging from 1 millisecond to 5 milliseconds, the hold time at peak temperature representing an anneal pulse, wherein the anneal pulse is repeated to diffuse the dopants by concentration enhanced diffusion in increments of 10 Å or less.

* * * * *